United States Patent
Xiu et al.

(10) Patent No.: US 7,356,107 B2
(45) Date of Patent: Apr. 8, 2008

(54) FLYING-ADDER FREQUENCY SYNTHESIZER-BASED DIGITAL-CONTROLLED OSCILLATOR AND VIDEO DECODER INCLUDING THE SAME

(75) Inventors: Liming Xiu, Plano, TX (US); Jason Meiners, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 325 days.

(21) Appl. No.: 10/829,770

(22) Filed: Apr. 22, 2004

(65) Prior Publication Data
US 2005/0162552 A1 Jul. 28, 2005

Related U.S. Application Data

(60) Provisional application No. 60/539,423, filed on Jan. 26, 2004.

(51) Int. Cl.
*H04L 7/00* (2006.01)
*H04L 7/04* (2006.01)
(52) U.S. Cl. .................................. 375/355; 375/371
(58) Field of Classification Search ................ 375/355, 375/354, 373–376, 359–361, 371; 348/500, 348/536, 521–524, 537
See application file for complete search history.

(56) References Cited

U.S. PATENT DOCUMENTS

| | | | |
|---|---|---|---|
| 6,329,850 B1 * | 12/2001 | Mair et al. ................... | 327/107 |
| 6,940,937 B2 * | 9/2005 | Xiu et al. ................... | 375/376 |
| 7,065,172 B2 * | 6/2006 | Xiu et al. ................... | 375/376 |
| 2003/0118142 A1 | 6/2003 | Xiu et al. | |
| 2004/0008805 A1 | 1/2004 | Xiu et al. | |

OTHER PUBLICATIONS

Xiu, "A Novel All Digital PLL With Software Adaptive Filter," IEEE Journal of Solid State Circuit vol. 39, No. 3, Mar. 2004, pp. 476-483.*
Mair et al., "An Architecture of High-Performance Frequency and Phase Synthesis", J. Solid State Circ., Vo. 35, No. 16 (IEEE, Jun. 2000), pp. 835-846.
Best, Phase-Locked Loops: Design, Simulation, and Applications (McGraw-Hill, 1997), pp. 177-199.

* cited by examiner

*Primary Examiner*—Tesfaldet Bocure
(74) *Attorney, Agent, or Firm*—Wade J. Brady, III; Frederick J. Telecky, Jr.

(57) ABSTRACT

A video decoder (52, 152) including a digital-control oscillator (DCO) (60, 160) is disclosed. The DCO (60, 160) includes a first flying-adder frequency synthesis circuit (74S) that measures an input signal frequency, such as the horizontal sync frequency of an input video signal. A frequency control word (FREQ) is generated in response to this input signal frequency, and is applied to a second flying-adder frequency synthesis circuit (74), which in turn selects the appropriate phases for leading and trailing edges of the output clock signal (PIX_CLK). Phase tuning of the output clock signal (PIX_CLK) can be effected by using an alternate flying-adder frequency synthesis circuit (74') architecture, in combination with a phase signal (PH) generated by a digital controller (61). Multiple phase-tuned sample clocks (PIX_CLK_A, PIX_CLK_B, PIX_CLK_C) can be similarly generated from multiple flying-adder frequency synthesis circuits (174A, 174B, 174C), each controlled by the frequency control word (FREQ) and a corresponding phase signal (PHA, PHB, PHC). Video mode control logic (65, 165) can also be implemented by way of a similar DCO architecture. The DCO (60) may be used to generate a clock signal at a large frequency multiple relative to the input signal, outside of the video decoder context.

14 Claims, 9 Drawing Sheets

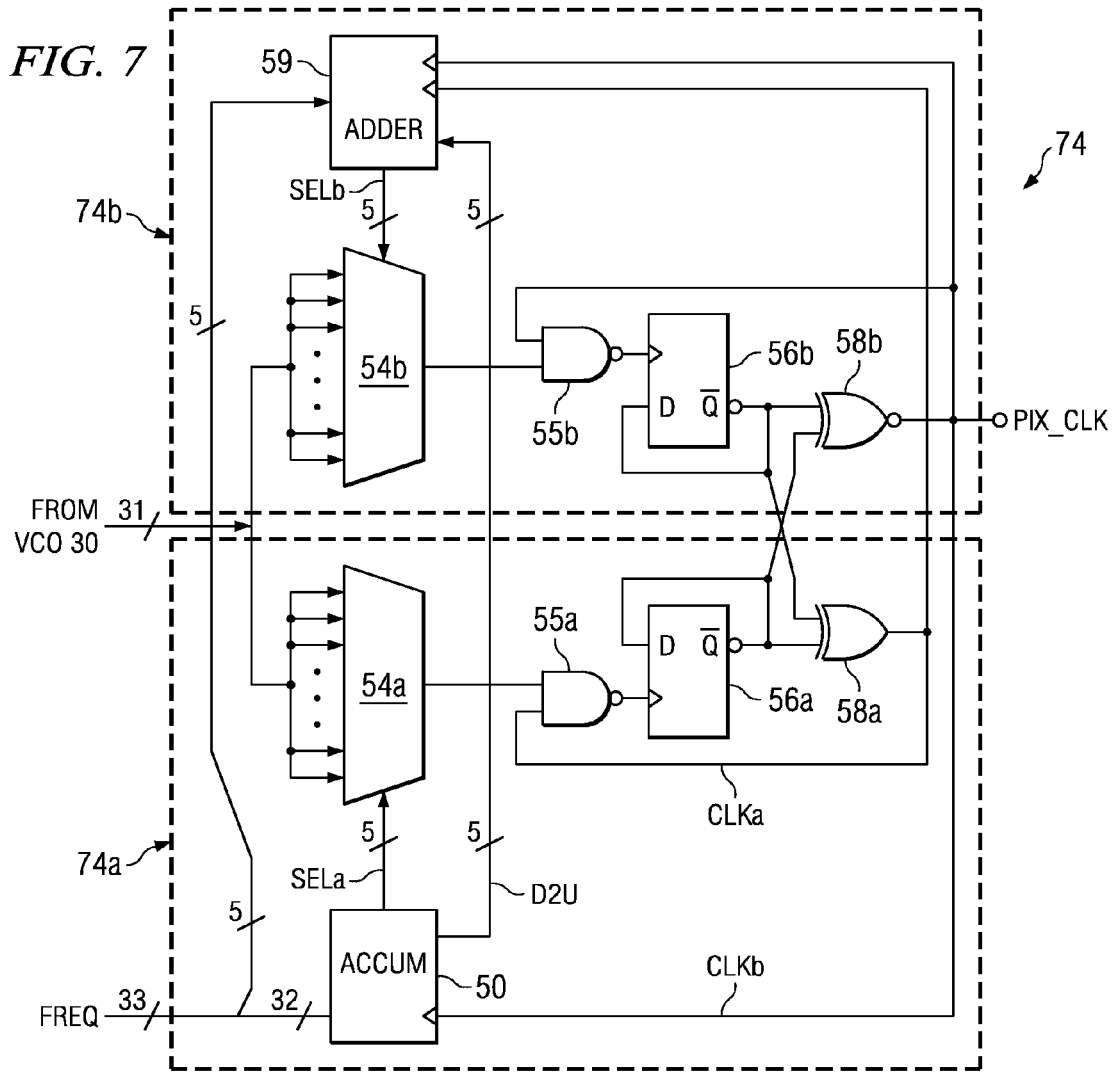

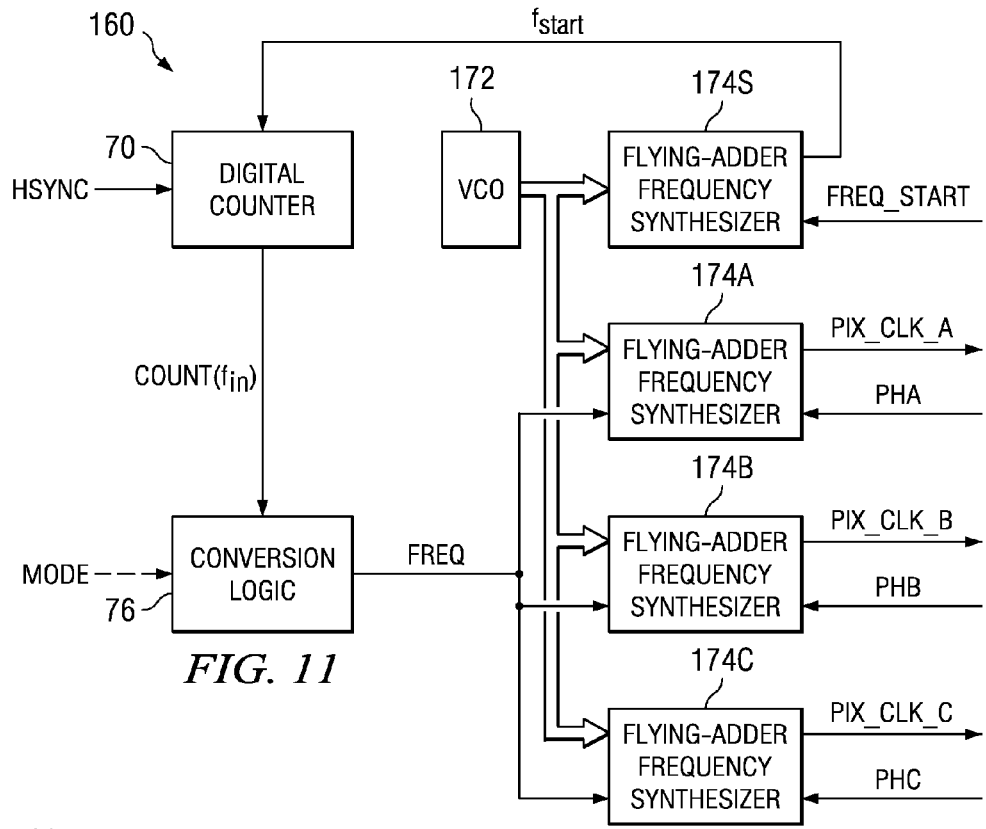
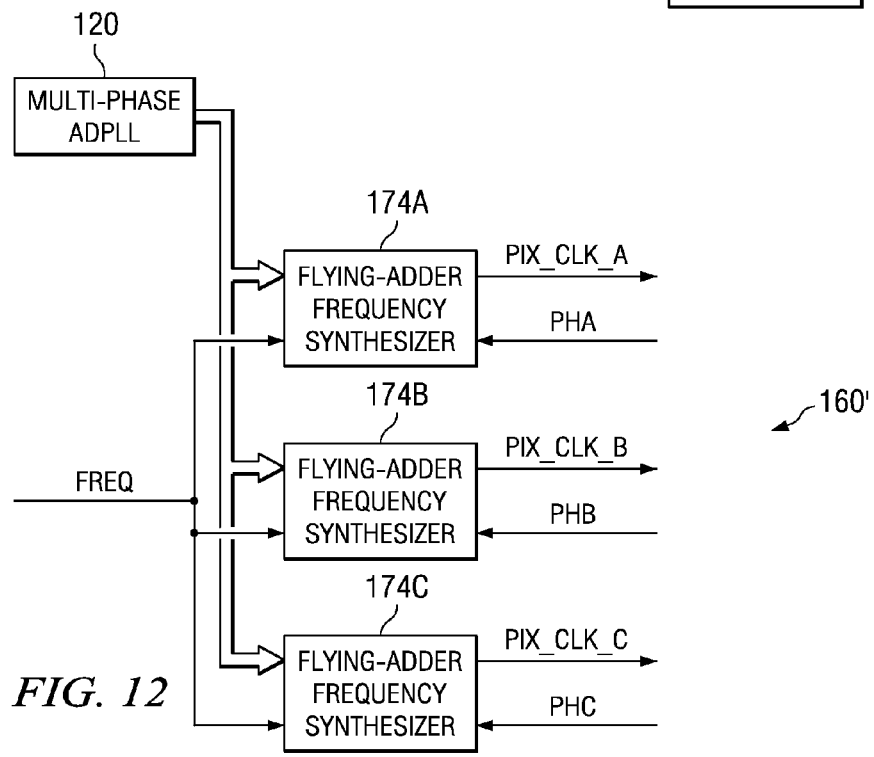
FIG. 11
FIG. 12

FLYING-ADDER FREQUENCY SYNTHESIZER-BASED DIGITAL-CONTROLLED OSCILLATOR AND VIDEO DECODER INCLUDING THE SAME

CROSS-REFERENCE TO RELATED APPLICATIONS

This application claims priority, under 35 U.S.C. §119(e), of Provisional Application No. 60/539,423, filed Jan. 26, 2004.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to phase-locked loop circuits.

As is fundamental in the art, many modern electronic systems include numerous integrated circuits that operate in conjunction with one another. For example, consumer-oriented systems such as televisions and home theaters include video decoders for decoding an input video signal into digital video output signals that are synchronized with a synchronization pulse contained within the incoming video signal itself. Modern spread-spectrum communications transmitters and receivers require the generation of high-frequency clock signals for the modulation and demodulation, respectively, of signals over the multiple subchannels of the spread spectrum bandwidth. In these and other electronic systems, the generation of periodic signals for clocking the operation of circuit functions based upon a system clock or synchronization pulse, is a common and often critical function.

A conventional approach for generating periodic signals based upon a reference clock utilizes the well-known phase-locked loop ("PLL"). In general, PLL circuits operate by comparing the time at which an edge of a reference clock is received with a corresponding edge of an internally generated clock. If a significant delay between these two edges is detected, the generation of the internal clock is adjusted to more closely match the received reference clock. In conventional analog PLLs, the frequency of a voltage controlled oscillator is adjusted by a filtered signal from a phase detector that compares system and chip clocks, so that the instantaneous frequency of the internal chip clock is advanced or retarded depending upon whether the chip clock lags or leads the system clock. Analog PLLs adjust the phase of the chip clock in a substantially continuous manner in response to a phase difference between the internal chip clock and the system clock. This smooth operation generally depends upon the filtering of the output of the phase detector circuit, but can be made quite well-behaved in many implementations. Additionally, by inserting frequency dividers in the forward and feedback loops, analog PLLs can be used to generate periodic signals of a selectable frequency multiple of the input reference clock.

Several types of digital PLLs (DPLLs), in which some of the signals communicated around the loop are in digital form, are known in the art. A specific class of DPLL is the so-called "all-digital" PLL (ADPLL), in which all signals in the loop are digital. Known implementations of ADPLLs include divide-by-N counters, increment-decrement (ID) counters, and digital waveform synthesizers. Several conventional ADPLL designs are described in Best, *Phase-Locked Loops: Design, Simulation, and Applications* (McGraw-Hill, 1997), pp. 177-199.

By way of further background, clock generator circuits based on a phase-locked loop (PLL) are described in Mair and Xiu, "An Architecture of High-Performance Frequency and Phase Synthesis", *J. Solid State Circ.*, Vo. 35, No. 16 (IEEE, June, 2000), pp. 835-46, and in U.S. Pat. No. 6,329,850 B1, issued Dec. 11, 2001 and commonly assigned herewith, both documents incorporated herein by this reference. In these "flying-adder" clock generation circuits, the voltage controlled oscillator (VCO) of the PLL produces a plurality of evenly-spaced output phases at a frequency that is locked to a reference clock. A register stores a digital value that selects the desired phase to be applied to the clock input of a toggle flip-flop from which the output clock is generated. A frequency synthesis circuit adds integer and fraction portions of an incoming frequency selection value to the current contents of the register. The fraction portion of the frequency selection value permits a time-averaged clock frequency to be produced with more precision than would be attained by the integer portions selecting the multiple VCO output phases. This article and U.S. patent also describe alternative realizations, including multiple frequency synthesis circuits based upon the same PLL and the generation of a phase-shifted secondary output from a phase synthesis circuit that is slaved to the frequency synthesis circuit. Additional performance is obtained by providing separate paths for producing the leading and trailing edges of the output clock.

By way of further background, U.S. patent application Publication No. US 2003/0118142A1, published Jun. 26, 2003, from copending and commonly assigned application Ser. No. 10/026,489, filed Dec. 24, 2001, and incorporated herein by this reference, describes another flying-adder clock generation circuit, based on the flying-adder architecture of the Mair and Xiu article and U.S. Pat. No. 6,329,850 B1. In particular, this copending application describes a clock generation circuit in which two or more frequency synthesis paths terminate at the inputs of a multiplexer, the output of which toggles a toggle mode bistable multivibrator (T flip-flop). Sequential selection of the synthesis paths is controlled in a synchronized manner with the output of the circuit, so that the synthesis path outputs sequentially toggle the flip-flop. In this way, the number of synthesis paths can be increased arbitrarily, with the scaling limited by the performance of control circuits for the output multiplexer. The propagation delay paths of each synthesis path can then extend to the multiple periods of the output clock, making higher output frequency possible. In addition, the toggle signal operates as a double-frequency clock signal.

By way of further background, U.S. patent application Publication No. US 2004/0008805 A, published Jan. 15, 2004, from copending and commonly assigned application Ser. No. 10/376,453, filed Feb. 26, 2003, and incorporated herein by this reference, describes a phase-locked loop using a flying-adder frequency synthesizer, in which a central processing unit generates a feedback divide integer in the feedback loop from the VCO output (which provides the multiple phases to the flying-adder). Because the CPU generates the feedback ratio, the flying-adder frequency synthesizer can be designed to use only integer values, effectively eliminating jitter while still providing low frequency error.

By way of further background, we have previously used a flying-adder frequency synthesizer in an all digital phase-locked loop (ADPLL) architecture, to great advantage. An example of a product incorporating such an ADPLL is the TVP5145 video decoder, manufactured and sold by Texas Instruments Incorporated. FIG. 1 illustrates, in block form, conventional video decoder 2 constructed in this manner.

Conventional video decoder 2 receives analog video signals (in this case, red, green, and blue component analog signals R, G, B, respectively), and converts these analog signals into digital signals that can be readily displayed by a modern digital video display, in the form of a cathode-ray tube (CRT), a liquid-crystal display (LCD), a projection unit utilizing DIGITAL LIGHT PROCESSING (DLP) technology and devices available from Texas Instruments, or the like. Red analog video component signal R is received by analog-to-digital converter (ADC) 4A, green analog video component signal G is received by ADC 4B, and blue analog video component signal B is received by ADC 4C. Each of ADCs 4 are conventional analog-to-digital converter circuits, and are for sampling their respective input analog signal and presenting a digital output signal corresponding to the amplitude of the sampled analog signal. Accordingly, each of ADCs 4 are clocked circuits, with pixel clock signal PIX_CLK defining the times at which ADCs 4 sample their respective inputs. As evident by its name and its function in defining the sample times, pixel clock signal PIX_CLK corresponds to the pixel rate of the video display, each period corresponding to a pixel of the display.

Conventional video decoder 2 also includes data format manager 6, which receives the sampled digital signals from ADCs 4 for the color components of the video signal, and processes and arranges these component signals as desired for the destination display. Data format manager 6 thus includes such functions as digital filtering of the signals, automatic gain control (AGC), and the like; alternatively, if the input video signal is a composite analog signal, sampled by a corresponding ADC, data format manager 6 may also include such other functions as luminance and chrominance separation. Digital display device interface 8 receives the processed digital video signals from data format manager 6, and performs the appropriate interfacing functions to apply the decoded digital video signals to the appropriate digital display device.

In this conventional architecture, all-digital phase-locked-loop (ADPLL) 10 generates pixel clock signal PIX_CLK from clock signal HYSNC, which is the reference to which pixel clock signal PIX_CLK is to be locked by ADPLL 10. Clock signal HSYNC corresponds to the horizontal sync pulse in conventional analog video signals, and which is used to synchronize each display line in the eventually display of the image. Video decoder 2 may include a detector circuit for detecting the horizontal sync pulse in the composite signal and generating clock signal HSYNC, or alternatively clock signal HSYNC may be present in the input signal or generated elsewhere. In any case, in this video decoder implementation, ADPLL 10 receives clock signal HSYNC and generates pixel clock PIX_CLK based on that signal.

As typical in conventional video decoders, video decoder 2 also includes digital processor 11, which is preferably a programmable logic device such as a microprocessor, microcontroller, digital signal processor (DSP), or the like, and which manages the operation of video decoder 2.

Referring now to FIG. 2, the construction of ADPLL 10 as used in conventional video decoder 2, for example corresponding to the TVP 5145 video decoder available from Texas Instruments Incorporated, will now be described. ADPLL 10 is arranged as a loop that includes the fundamental functions of a phase detector, loop filter, controllable oscillator, and frequency divider, but the signals traveling this loop are all in the digital domain, as reflected in the "all-digital" nomenclature of ADPLL 10.

In conventional ADPLL 10, digital phase detector 12 includes a latch, clocked by clock signal HSYNC, and which generates digital phase error word PH_ERR and forwards this word to digital low-pass loop filter 14. The data input of digital phase detector 12 receives a pixel count value PIX_CNT from counter/frequency divider 18. Counter/frequency divider 18 is a binary counter that increments pixel count value PIX_CNT with each cycle of pixel clock signal PIX_CLK from zero toward a maximum pixel value max_pix−1, and then restarts from zero with the next cycle of pixel clock signal PIX_CLK. The maximum pixel count max_pix−1 preferably corresponds to the number of pixels in a display line (i.e., the value max_pix is the number of pixels per line). A frequency divider function in counter/frequency divider 18 may also divide the frequency of pixel clock signal PIX_CLK to produce another output clock signal OUT_CLK.

Upon digital phase detector 12 receiving an edge of clock signal HSYNC, digital phase detector 12 latches the current value of digital signal PIX_CNT from counter/frequency divider 18. Digital phase detector 12 calculates phase error word PH_ERR from this latched value of PIX_CNT. The range of phase error word PH_ERR is centered over ±π radians, by simple program code:

$$\text{if } \text{pix\_cnt} < \left(\frac{\text{max\_pix}}{2}\right)$$
$$\text{ph\_err} = \text{pix\_cnt} + 1 \text{ else}$$
$$\text{ph\_err} = \text{pix\_cnt} - \text{max\_pix}$$

where pix_cnt is the latched value of digital signal PIX_CNT, and where ph_err is the value of digital word PH_ERR being generated in this iteration. A digital phase error value ph_err of zero, corresponding to true phase-lock, is unstable because this value corresponds to an error between maximum count value max_pix−1 and +1 (0 being between these values). These calculations therefore ensure that the value ph_err will never equal zero, because the value of pix_cnt can never equal −1 (resulting in ph_err=0), nor can it equal the value max_pix (because counter 18 wraps around at max_pix−1), thus avoiding the "dead zone" of ph_err=0. Phase error digital signal PH_ERR is centered around a value of 0 phase error, having a range of ±π.

When pixel clock signal PIX_CLK is synchronized with reference signal HSYNC, phase error value PH_ERR will remain substantially constant. In addition, to the extent that phase shifts in the reference signal HSYNC occur, the output of digital phase detector 12 is substantially linear.

The digital phase error word PH_ERR is then applied to digital low-pass loop filter 14. As known in the PLL art, a loop filter is important in ensuring phase-locking of the circuit, by reducing the sensitivity of the loop to small and rapid changes in phase difference. According to the preferred embodiment of the invention, loop filter 14 is a digital filter. Preferably, loop filter 14 is implemented in software, as a program sequence executed by digital processor 11 (FIG. 1) or other circuitry operating in or with ADPLL 10.

In general, digital low-pass loop filter 14 filters the values of phase error word PH_ERR to produce frequency control word FREQ, which in turn is applied to digital control oscillator (DCO) 15 according to this embodiment of the invention. Frequency control word FREQ indicates the frequency at which DCO 15 is to generate its output clock signal, preferably as a floating-point (integer plus fraction) multiple of a reference frequency based on a reference clock signal REF_CLK generated by oscillator 16 and applied to DCO 15. Pixel clock signal PIX_CLK is defined by the frequency selected by frequency control word FREQ.

By way of further background, referring now to FIG. 3, the construction of DCO 15, as implemented in conventional video decoder 2 corresponding to the TVP 5145 video decoder available from Texas Instruments Incorporated, will now be described. In summary, DCO 15 includes a conventional PLL 20 (which may be an analog or digital PLL), which produces multiple phases of a clock signal that is based on and locked to reference clock signal REF_CLK. These output phases are applied to flying-adder frequency and phase synthesizer 52, which also receives frequency control word FREQ from loop filter 14, and generates pixel clock signal PIX_CLK.

In the example of DCO 15 shown in FIG. 3, PLL 20 is a conventional analog PLL, including phase-frequency detector (PFD) 22 receiving reference clock REF_CLK and a feedback clock from divider 28. The output of PFD 22, which is typically a pulse having a width corresponding to the phase difference between the reference and feedback clocks, controls charge pump 26 to raise or lower its output voltage, depending on the polarity of the phase difference and its duration. The output of charge pump 26, filtered by low-pass filter 26, is applied to voltage-controlled oscillator (VCO) 30 as the control voltage. VCO 30 generates multiple phases of an output clock signal, locked in frequency to reference clock REF_CLK. These multiple clock phases are applied to flying-adder frequency synthesis circuit 52 for the generation of pixel clock PIX_CLK, and one of these phases is applied to frequency divider 28, from which the feedback clock applied to PFD 22 is generated.

In this example, VCO 30 generates thirty-two clock phases, at a frequency corresponding to that of reference clock REF_CLK. The time between successive phases at the output of VCO 30 determines the resolution at which APDLL 10 generates pixel clock signal PIX_CLK. For example, reference clock REF_CLK may be generated by a conventional crystal-based oscillator 16 at a frequency of 14.31818 MHz, divided down by a factor of eight. Adjacent clock phases based on this reference clock signal are therefore spaced apart by 0.282 nsec.

Detailed description of the construction and operation of flying-adder synthesis circuit 52 may be found in Mair and Xiu, "An Architecture of High-Performance Frequency and Phase Synthesis", *J. Solid State Circ.*, Vo. 35, No. 16 (IEEE, June, 2000), pp. 835-46; U.S. Pat. No. 6,329,850 B1, issued Dec. 11, 2001 and commonly assigned herewith; U.S. patent application Publication No. US 2003/0118142A1, published Jun. 26, 2003, from copending and commonly assigned application Ser. No. 10/026,489, filed Dec. 24, 2001; and U.S. patent application Publication No. US 2004/0008805 A, published Jan. 15, 2004, from copending and commonly assigned application Ser. No. 10/376,453, filed Feb. 26, 2003; all incorporated herein by this reference.

As mentioned above, ADPLL 10 implements loop filter 14 in the purely digital domain, for example by way of a software routine, stored at and executed by digital processor 11 (FIG. 1) along with its other functions. For example, if loop filter 14 is implemented by a software routine executed by digital processor 11, digital processor 11 would effectively compute each frequency control word FREQ from the current value of phase error word PH_ERR, according to a digital filter equation or routine.

An example of a first-order filter suitable for loop filter 14 according to the preferred embodiment of the invention, such a filter readily implementable by way of a software routine, may have a transfer function H(z) (in the z-domain) such as:

$$H(z) = G_1 + \frac{G_2}{1 - z^{-1}}$$

In the conventional implementation of loop filter 14 in software, the gain values $G_1$, $G_2$ are simply stored in memory of digital processor 11.

By way of further background, various types of digital-controlled oscillators (DCOs) are known in the art. These DCO types range from a simple divide-by-N counter, in which a digital counter modulo-counts cycles of a fixed high-frequency oscillator output, with the modulo value selected by a digital frequency select word. Increment-decrement (ID) counters are the basis of another type of DCO, in which output clock edges are generated in response to carry and borrow signals from a loop filter, in combination with an input clock signal at a fixed high frequency. These and other conventional DCOs, as well as conventional phase-locked loops, typically depend upon the stability of the input clock signal. Accordingly, if significant jitter or noise is present on the input clock signal, this jitter and noise tends to couple to the output clock signal. This is of course undesirable. However, in many circuit applications, such as in video decoders, jitter and noise on the incoming clock signal cannot be avoided, and therefore it is difficult in such applications to digitally generate a stable and clean output clock signal.

Furthermore, conventional DCO and PLL circuits are typically not able to generate a stable and high-fidelity clock signal that has a frequency at a large multiple of the input clock signal. FIG. 4 illustrates a conventional PLL-based frequency multiplier. In this example, the input signal is at frequency $f_{in}$, and is received at one input of conventional phase detector 32. Phase detector 32 generates a signal corresponding to the phase difference between the input signal and the feedback signal from divide-by-N frequency divider 38; this signal is filtered by loop filter 34, and then applied to VCO (or DCO, as the case may be) 36. VCO 36 then generates an output signal at frequency $f_{out}$, which is also fed back to frequency divider 38 for generation of the feedback signal to phase detector 32. The feedback arrangement of this conventional PLL ensures that, in the steady-state, the phase error between the input signal and the output of frequency divider 38 tends to zero. In other words, VCO 36 is controlled so that its output signal at frequency $f_{out}$ locks to a frequency and phase such that the feedback signal from frequency divider 38, at frequency $f_{out}/N$, is synchronized with the input signal at frequency $f_{in}$. This forces the output clock signal frequency $f_{out}$ to the frequency $f_{in}*N$.

It has been observed, however, that the maximum value of multiplier N that can still result in a stable output frequency $f_{out}$ is limited in this conventional architecture of FIG. 4. For example, if N is on the order of 1000 or greater, the rate at which phase-detector 32 updates the phase synchronization is quite low, on the order of 1000 or more cycles of the output clock signal at frequency $f_{out}$. This slow update rate generally results in drift of the output frequency $f_{out}$. Especially in applications, such as video decoders, that rely upon stable clock signal frequencies for high fidelity operation, significant frequency drift cannot be tolerated.

BRIEF SUMMARY OF THE INVENTION

It is an object of this invention to provide a digital-control oscillator (DCO) that can implement a large frequency multiplier without vulnerability to frequency drift.

It is a further object of this invention to provide such a DCO in which the jitter and noise at the input clock signal do not propagate to the output clock signal.

It is a further object of this invention to provide circuitry that can accurately measure the frequency of an incoming clock signal, such as a sync frequency in a video signal, and to use this measured frequency to establish an operating mode.

It is a further object of this invention to provide an all-digital phase-locked loop (ADPLL) circuit that can precisely control the sample times of multiple input signals.

Other objects and advantages of this invention will be apparent to those of ordinary skill in the art having reference to the following specification together with its drawings.

This invention may be implemented into a digital-control oscillator (DCO) that is capable of generating an output signal at a large multiplier relative to the input reference signal. A flying-adder frequency synthesizer generates a clock signal at a known high frequency, which is used to measure the frequency of the input reference signal, for example by way of a simple counter. The measured frequency value is then converted into a frequency control word, which is applied as a digital control word to a flying-adder frequency synthesizer to generate the high frequency output clock signal.

According to another aspect of the invention, a flying-adder frequency synthesizer circuit is incorporated into a video decoder to measure the frequency of a sync signal (either or both of the horizontal and vertical sync pulses). The measured frequencies are then used to determine the mode, or standard, of the input video signal. The video decoder incorporating this circuit is thus able to operate according to multiple video signal modes.

According to another aspect of the invention, a DCO or an all-digital phase-locked loop is used to generate a sample clock having a desired frequency and a precisely controlled phase. This circuit is useful in many applications, such as a video decoder, to precisely sample an input video signal. The selected phase is made available from a flying-adder frequency synthesizer.

According to another aspect of the invention, a DCO or an all-digital phase-locked loop is used to generate multiple phases of a sample clock, for example as used in a video decoder to precisely sample each component of a multiple-component input video signal. The multiple phases are made available from multiple flying-adder frequency synthesizers.

BRIEF DESCRIPTION OF THE SEVERAL VIEWS OF THE DRAWING

FIG. 7 is an electrical diagram, in block form, of a flying-adder frequency synthesizer as may be implemented in the DCO of FIG. 6 according to the first preferred embodiment of the invention.

FIG. 11 is an electrical diagram, in block form, of a DCO and multiple flying-adder frequency and phase synthesizer circuits as may be implemented in the video decoder of FIG. 10.

FIG. 12 is an electrical diagram, in block form, of an all-digital phase-locked loop (ADPLL) and multiple flying-adder frequency and phase synthesizer circuits as may be implemented in the video decoder of FIG. 10.

DETAILED DESCRIPTION OF THE INVENTION

The present invention will be described in connection with its preferred embodiment, namely as implemented into a video decoder, considering that this invention provides particular benefit in such an application. However, those skilled in the art having reference to this specification will readily recognize that this invention will have benefit in any digital circuit or system that utilizes a phase-locked loop, or indeed that could benefit from a digitally-generated stable clock signal. Accordingly, it is to be understood that the following description is provided by way of example only, and is not intended to limit the true scope of this invention as claimed.

Figure 5:
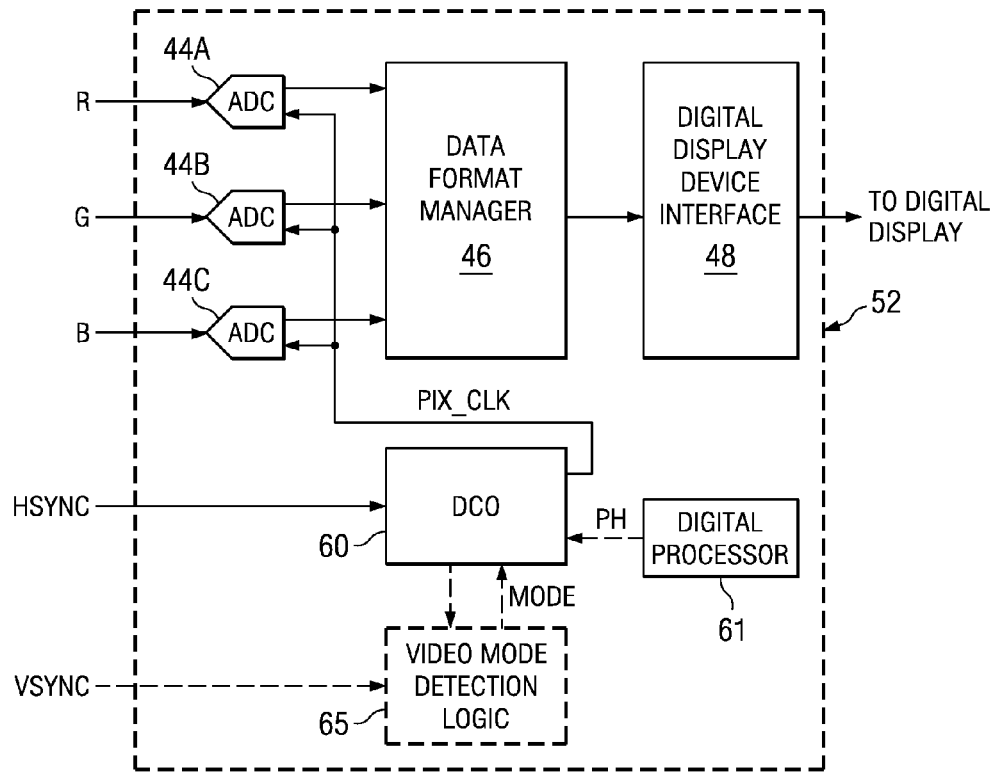
FIG. 5 is an electrical diagram, in block form, of a video decoder constructed according to a first preferred embodiment of the invention.

FIG. 5 illustrates an exemplary digital circuit, namely video decoder 52, into which the preferred embodiment of this invention is implemented. The overall function of video decoder 52 is to convert an input analog signal, received from any one or more of a number of conventional video signal sources (antenna, tuner, set-top box, DVD player, satellite receiver, etc.) into digital signals formatted for display by a modern digital video display, in the form of a cathode-ray tube (CRT), a liquid-crystal display (LCD), a projection unit utilizing DIGITAL LIGHT PROCESSING (DLP) technology and devices available from Texas Instruments, or the like. The architecture of video decoder 52 in FIG. 5 is a relatively high level example, it being understood by those skilled in the art that the present invention may be implemented into video decoders of any one of a number of architectures, and indeed into any digital circuit or system that can utilize phase-locked loop clock signal generation.

Analog to digital converters 44A, 44B, 44C each receive a corresponding component of an input analog video signal (in this case, red, green, and blue component analog signals R, G, B, respectively), and respectively convert these analog signals into digital signals. Each of ADCs 44 are conventional analog-to-digital converter circuits, each sampling its respective input analog signal at sample times indicated by pixel clock signal PIX_CLK, and presenting digital values corresponding to the amplitude of the analog signal at the sample times. As evident by its name and its function in defining the sample times, pixel clock signal PIX_CLK corresponds to the pixel rate of the video display, each period corresponding to a pixel of the display.

According to this first preferred embodiment of the invention, pixel clock signal PIX_CLK is generated by digital-control oscillator (DCO) 60. The detailed construction of DCO 60 according to this first preferred embodiment of the invention will be described in further detail below. According to this embodiment of the invention, DCO 60 generates pixel clock signal PIX_CLK from clock signal HSYNC, which is the horizontal sync pulse in conventional analog video signals that synchronizes each display line in the eventual display of the image. Video decoder 52 may include a detector circuit for detecting the horizontal sync pulse in the composite signal and generating clock signal HSYNC, or alternatively clock signal HSYNC may be present in the input signal or generated elsewhere.

Video decoder 52 also includes data format manager 46, which receives the sampled digital signals from ADCs 44 for the color components of the video signal, and processes and arranges these component signals as desired for the destination display. Data format manager 46 thus includes such functions as digital filtering of the signals, automatic gain control (AGC), and the like; alternatively, if the input video signal is a composite analog signal, sampled by a corresponding ADC, data format manager 46 may also include such other functions as luminance and chrominance separation. Digital display device interface 48 receives the processed digital video signals from data format manager 46, and performs the appropriate interfacing functions to apply the decoded digital video signals to the appropriate digital display device.

As typical in conventional video decoders, video decoder 52 also includes digital processor 61, which is preferably a programmable logic device such as a microprocessor, microcontroller, digital signal processor (DSP), or the like. Digital processor 61 preferably manages the operation of video decoder 52, for example by receiving control parameters from the user or peripheral devices (e.g., the digital display or the input signal source) and controlling the operation of data format manager 46, digital display device interface 48, and other circuits accordingly. In addition, depending upon its computational capacity, digital processor 61 may also perform some of the video signal processing applied by data format manager 46, for example in co-processor fashion; alternatively, data format manager 46 may be realized within digital processor 61. Digital processor 61 may also provide computational resources for formatting the received video signal, for example as a digital loop filter function. Optionally, as will be described below, digital processor 61 may generate one or more digital phase signals PH that are applied to DCO 60, for precisely tuning the phase of the sample clock edges of pixel clock PIX_CLK.

Video decoder 52 of FIG. 5 also optionally includes video mode detection logic 65. As known in the art, there are many different video modes, corresponding to various industry standards, such as those promulgated through the Video Electronics Standards Association (VESA). Considering that a wide array of video sources and digital display sizes and resolutions are available in the market, it would be useful if video decoder 52 could recognize the particular standard followed by the input video signal, and control the generation of its pixel clock and other video decoder operation accordingly. As will be described in further detail below, video mode detection logic 65 provides this optional capability in video decoder 52.

Figure 6:
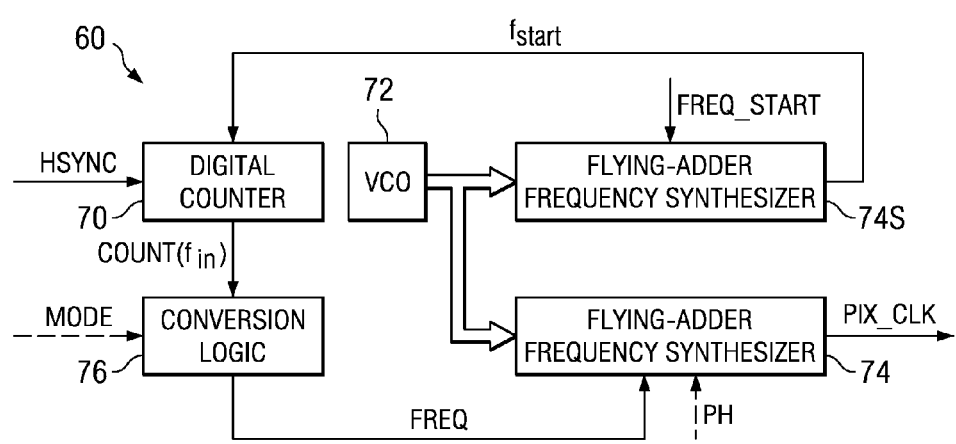
FIG. 6 is an electrical diagram, in block form, of a digital-control oscillator (DCO) circuit in the video decoder of FIG. 5 according to the first preferred embodiment of the invention.

Referring now to FIG. 6, the construction and operation of DCO 60 according to the first preferred embodiment of the invention will now be described in detail. According to this embodiment of the invention, pixel clock signal PIX_CLK may be at a very high frequency relative to clock signal HSYNC. As mentioned above relative to the background of the invention, conventional frequency multiplier circuits, including those serving as DCOs, are limited in the multiplier by which they can precisely generate an output clock signal, particularly because of their relatively slow update rate, relative to the number of output clock pulses. In addition, these conventional circuits tend to couple noise and jitter from the input clock signal to the output clock signal. The ability of conventional DCOs to accurately generate a high-precision high-multiplier clock signal is therefore limited.

As will become apparent from this description, DCO 60 may be used in applications other than pixel clock generation for a video decoder. Indeed, DCO 60 may be used in any system application in which the generation of a high quality clock signal, at a large frequency multiple relative to an input or reference clock signal, is desired.

Figure 3:
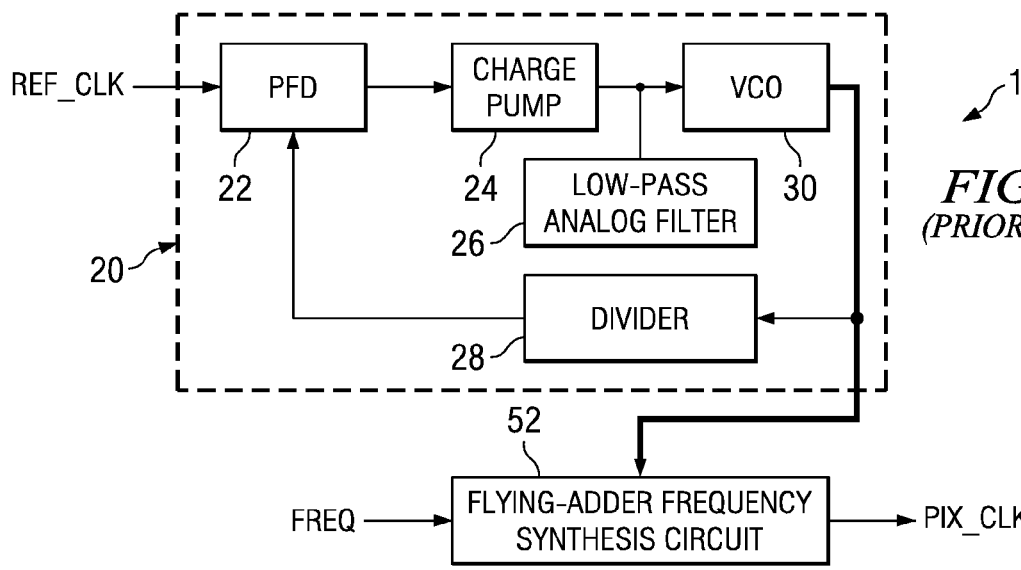
FIG. 3 (Prior Art) is an electrical diagram, in block form, of a digital-control oscillator (DCO) as used in the conventional ADPLL of FIG. 2.
Figure 4:
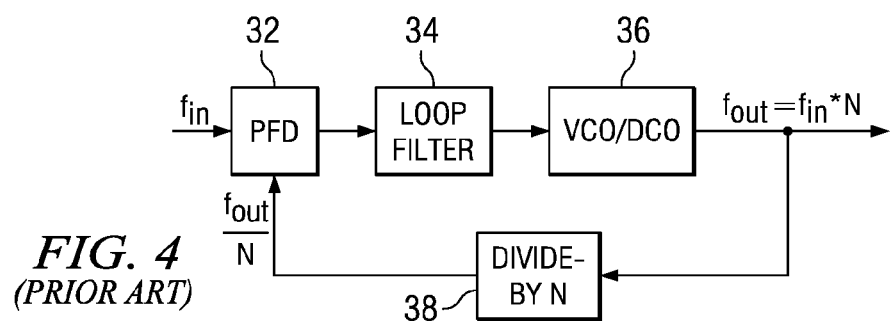
FIG. 4 is an electrical diagram, in block form, of a conventional phase-locked loop frequency multiplier circuit.

DCO 60 includes voltage-controlled oscillator (VCO) 72, which generates multiple phases (e.g., thirty-two uniformly spaced phases) of a reference clock signal. VCO 72 is preferably constructed similarly as VCO 30 described above relative to FIG. 3. These multiple phases are applied to two flying-adder frequency synthesizer circuits 74S, 74, according to this preferred embodiment of the invention.

Referring now to FIG. 7, an example of the construction of flying-adder frequency synthesis circuit 74S will now be described. While it is contemplated that flying-adder frequency synthesizer circuits 74S, 74 need not be constructed identically (indeed, it may be preferably for flying-adder frequency synthesizer circuit 74S to be a simpler construction than circuit 74), the description of flying-adder frequency synthesizer circuit 74 as shown in FIG. 7 is provided by way of example for both of circuits 74S, 74. Detailed description of the construction and operation of this and other examples of flying-adder synthesis circuit 74 may be found in Mair and Xiu, "An Architecture of High-Performance Frequency and Phase Synthesis", *J. Solid State Circ.*, Vo. 35, No. 16 (IEEE, June, 2000), pp. 835-46; U.S. Pat. No. 6,329,850 B1, issued Dec. 11, 2001 and commonly assigned herewith; U.S. patent application Publication No. US 2003/0118142A1, published Jun. 26, 2003, from copending and commonly assigned application Ser. No. 10/026,489, filed Dec. 24, 2001; and U.S. patent application Publication No. US 2004/0008805 A, published Jan. 15, 2004, from copending and commonly assigned application Ser. No. 10/376, 453, filed Feb. 26, 2003; all incorporated herein by this reference. It is contemplated that flying-adder synthesis circuit 74 according to any of the alternatives described in these incorporated patents and article, and equivalents to those disclosed circuits, may be incorporated into ADPLL 10 according to this embodiment of the invention, In this example, frequency synthesis circuit 74 is pipelined, to permit higher frequency output clocks nearing the theoretical limit. As shown in FIG. 7, frequency synthesis circuit 74 includes two paths 74a, 74b, for generating the leading and trailing edges of pixel clock signal PIX_CLK, respectively. Each of paths 74a, 74b includes a respective thirty-two to one multiplexer 54a, 54b for selecting one of the thrt-two clock phases provided by VCO 30 of PLL 20 (FIG. 3) in response to select values presented on lines SELa, SELb, respectively. Because frequency synthesis circuit 74 effectively includes two interlocked thirty-two to one multiplexers 54, sixty-four potential phases are now available for use in the generation of the output clock signal on line PIX_CLK; as such, six integer bits are required to select among these potential phases. According to this preferred embodiment of the invention, the most significant five bits FREQ[32:28] of frequency control word FREQ are forwarded to adder 59 in path 74b for use in the generation of the trailing edge of the output clock signal, whileth second through least significant bits FREQ[31:0] are forwarded to accumulator 50 in path 74a.

According to this embodiment of the present invention, the outputs of multiplexers 54a, 54b are respectively applied to one input of a corresponding NAND gate 55a, 55b. The outputs of NAND gates 55a, 55b are applied to the clock inputs of D-flip-flops 56a, 56b, respectively; each of flip-flops 56a, 56b are connected in toggle fashion, with their inverting outputs applied to their D inputs. The outputs of flip-flop 56a, 56b are each applied to the inputs of exclusive-OR gate 58a and exclusive-NOR gate 58b. Additionally, line CLKa is connected to a second input of NAND gate 55a and to a clock input of adder 59 and line CLKb is connected to a second input of NAND gate 55b and to clock inputs of accumulator 50 and adder 59.

In path 74a, multiplexer 54a is controlled by lines SELa generated by accumulator 50; simidlarly, in path 74b, multiplexer 54b is controlled by lines SELb generated by adder 59. Each of accumulator 50 and adder 59 are preferably constructed in a pipelined fashion, so that accumulator 50 generates its next value on lines SELa while the trailing edge of pixel clock signal PIX_CLK is being generated by path 74b, and so that adder 59 generates its next value for lines SELb while the leading edge of pixel clock signal PIX_CLK is propagating through path 74a. Synchronization of paths 74a, 74b with one another is accomplished by lines D2U, which effectively communicate the value on lines SELa from accumulator 50 to adder 59. The pipelined construction of accumulator 50 and adder 59 is described in detail in U.S. Pat. No. 6,329,850 B1, incorporated hereinto by the above reference.

During generation of the leading edge of the output clock signal, line CLKa is high, enabling the output of multiplexer 54a to toggle flip-flop 56a, and line CLKb is low. As is evident from FIG. 7, lines CLKa, CLKb are necessarily complementary to one another, considering that exclusive-OR gate 58a and exclusive-NOR gate 58b receive the same inputs but generate opposite output states relative to one another. The following description will begin with the initial states of the outputs of flip-flops 56a, 56b opposite from one another, such that line CLKa is high and line CLKb and pixel clock signal PIX_CLK are low.

At this point in time, the currently stored integer value in accumulator 50 has been applied to multiplexer 54a to select a corresponding phase of the output of VCO 30. Upon a trailing edge of this selected phase, which passes to NAND gate 55a through multiplexer 54a, the output of NAND gate 55a makes a low-to-high transition, which toggles flip-flop 56a to now match the output of flip-flop 56b (these states being complementary previously). This toggling causes the output of exclusive-OR gate 58a to make a high-to-low transition, and also causes the output of exclusive-NOR gate 58b to make a low-to-high transition, thus issuing a rising edge of pixel clock signal PIX_CLK and driving line CLKb from low to high. Line CLKa is of course driven low by exclusive-OR gate 58a, locking out NAND gate 55a from responding to the output of multiplexer 54a.

While the rising edge of the output clock is being generated through path 74a, path 74b is updating the value of its selection integer to be applied to multiplexer 54b on lines SELb. When line CLKa is high and line CLKb is low, the output of NAND gate 55b is forced high to block pulses from multiplexer 54b from affecting the state of flip-flop 56b. The updating of path 54b is accomplished through the operation of adder 59 adding the integer portion of lines FREQ to the current value of the integer portion in accumulator 50, presented on lines D2U, to provide a new integer sum. Upon the low-to-high transition of line CLKb, this new value is stored. Once line CLKa is low and line CLKb is high, path 74b selects the phase from VCO 30 for use in generating the trailing edge of pixel clock signal PIX_CLK. The contents of adder 59 are applied to multiplexer 54b. The next trailing edge of this phase is then passed to NAND gate 55b which, because line CLKb is now high, toggles the state of flip-flop 56b, causing its output to now differ from that of flip-flop 56a. This state causes exclusive-NOR gate 58b to drive line COUT low again, along with line CLKb. These same inputs cause exclusive-OR gate 58a to drive a low-to-high transition at its output on line CLKa.

While line CLKa is low and blocking transitions from multiplexer 54a from toggling flip-flop 56a, accumulator 50 is updating its contents for the next cycle, by adding frequency control word FREQ to the integer value currently being applied to multiplexer 54a, appended with an accumulated fractional portion. The sum of this addition is then stored upon the low-to-high transition of pixel clock signal PIX_CLK.

The interlocking of paths 74a and 74b by exclusive-OR gate 58a and exclusive-NOR gate 58b permits the updating of the multiplexer selection words in each path while the opposite path is propagating the clock edge. In addition, the use of two paths splits the timing requirements of the logic operation to be performed in each half-cycle of the output clock, thus permitting the generation of an output clock that can approach the theoretical frequency limit.

Further details regarding the operation of flying-adder frequency synthesis circuit 74, and various alternative implementations, are provided by the publications that are incorporated into this specification by reference, as listed above.

Referring back to FIG. 6, DCO 60 according to this preferred embodiment of the invention uses flying-adder frequency synthesizer 74S to measure the frequency of clock signal HSYNC. Accordingly, the output of flying-adder frequency synthesizer 74S is a clock signal at a fixed, very high, frequency $f_{start}$ (e.g., on the order of 500 MHz or higher), which is based on the fixed output of VCO 72 according to the digital value of control word FREQ_START, preferably generated by digital processor 61 (in the example of video decoder 52 shown in FIG. 5). This fixed high-frequency clock signal is applied to the clock input of digital counter 70. Digital counter 70 is a conventional counter that counts pulses of its clock signal (at frequency $f_{start}$) relative to selected edges of clock signal HSYNC (e.g., between successive leading edges, or between a leading edge and the next trailing edge, or between a trailing edge and the next leading edge, etc.). For example, clock signal HSYNC may simply be applied to a reset input of digital counter 70, effectively restarting the count from a base value upon each edge of clock signal HSYNC, and outputting or latching the contents of digital counter 70 at that time. The output of digital counter 70 is presented on lines COUNTS($f_{in}$), and thus corresponds to the number of cycles of fixed frequency clock signal $f_{start}$ within a cycle (or half-cycle, if desired) of clock signal HSYNC. Lines COUNT($f_{in}$) are presented to conversion logic 76, as a measure of the frequency of clock signal HSYNC. The high frequency $f_{start}$ (e.g., at 500 MHz or greater) relative to the nominal frequency of clock signal HSYNC (e.g., at 100 kHz or less) results in an extremely accurate measurement of the frequency of clock signal HSYNC.

According to the exemplary implementation of DCO 60 as a circuit for generating a sample (pixel) clock in video decoder 52, it is desirable that this pixel clock PIX_CLK be generated at a frequency corresponding to the number of pixels within a given region of the input video signal. In this example, where clock signal HSYNC (i.e., the horizontal sync pulse) is used as the input clock signal, it is desirable that the sampling pixel clock PIX_CLK be at a frequency corresponding to the number of pixels in a given display line. Accordingly, conversion logic 76 has the function of generating a digital word on lines FREQ that will control flying-adder frequency synthesis circuit 74 to generate pixel clock PIX_CLK at the appropriate sample rate for the input video signal synchronized with clock signal HSYNC. It is contemplated that those skilled in the art having reference to this specification will be readily able to construct the appropriate combinatorial logic, arithmetic logic, look-up table, or the like for accomplishing this function.

The digital control word on lines FREQ is then applied to flying-adder frequency synthesizer 74, which generates the desired output clock signal (in this example, pixel clock PIX_CLK) as a multiple of the measured input signal frequency of clock signal HSYNC. As evident from the construction and operation described above, it will be apparent that noise and jitter present on clock signal HSYNC will not couple directly out to pixel clock PIX_CLK, except in the event of gross error that affects the measurement of the frequency of clock signal HSYNC by digital counter 70. In addition, because of its flying-adder construction, frequency synthesis circuit 74 generates a precise and stable output clock signal that can be at a frequency that is a large multiple of that of the input clock signal HSYNC, for example as large as 1000 or larger.

As shown in FIGS. 5 and 6, an optional phase adjustment can be applied to pixel clock PIX_CLK, for example by digital processor 61, according to a second preferred embodiment of the invention. It is contemplated that high performance video and other systems may require precise adjustment and tuning of its sample clocks. For example, high-definition television (HDTV) greatly increases the resolution of the displayed image by increasing the number of lines and pixels in each frame, which in turn requires higher sampling rates. These higher rates in turn can require precise placement of the sample clocks within the video signal. The ability to tune the sample clock edges, by way of a phase adjustment, is therefore desirable.

Figure 8A:
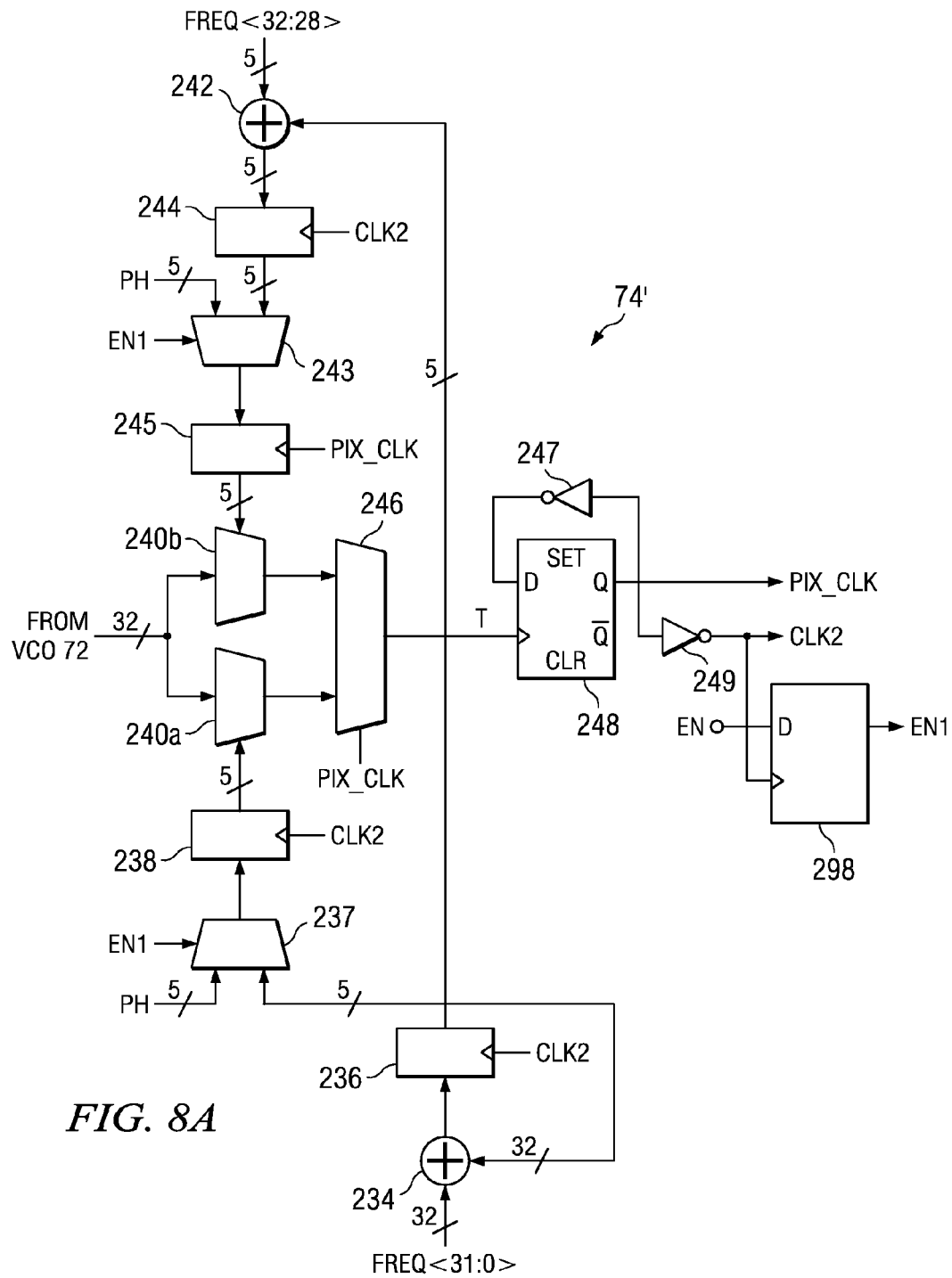
FIGS. 8A through 8C are electrical diagrams, in block form, of flying-adder frequency and phase synthesizers as may be implemented in the DCO of FIG. 6 according to a second preferred embodiment of the invention.

According to this embodiment of the invention, digital process 61 generates a digital phase adjustment signal PH, based on user inputs or on a tuning or other automated tuning algorithm. Phase signal PH is applied to DCO 60 as shown in FIG. 5, more specifically to flying-adder frequency synthesis circuit 74 in DCO 60 as shown in FIG. 6. Referring now to FIG. 8A, the construction of flying-adder frequency synthesis circuit 74' according to this embodiment of the invention will now be described. Additional detail regarding the construction and operation of phase-adjustable flying-adder frequency synthesis circuit 74' is provided in U.S. patent application Publication No. US 2003/0118142A1, published Jun. 26, 2003, from copending and commonly assigned application Ser. No. 10/026,489, filed Dec. 24, 2001, incorporated herein by reference.

As evident from FIG. 8A, the construction of flying-adder frequency synthesis circuit 74' is substantially similar to that described above for flying-adder frequency synthesis circuit 74 of FIG. 7. As such, the clock phases from VCO 72 are applied to inputs of multiplexers 240a, 240b, which are thirty-two-to-one multiplexers for selecting according to the digital value applied by registers 245, 238, respectively. The outputs of multiplexers 240a, 240b are connected to two-to-one multiplexer 246, which selects between the outputs of multiplexers 240a, 240b, in response to output pixel clock signal PIX_CLK. The output of multiplexer 246 in turn is connected to the clock input of D-type flip-flop 248, configured in toggle fashion via inverter 247, and driving pixel clock signal PIX_CLK from its Q output and clock signal CLK2 via inverter 249.

Clock signal CLK2 is applied to the clock input of D-type flip-flop 298, which receives an enable signal EN at its D input, and which generates enable signal EN1 at its positive output. Enable signal EN1 is used to apply a phase shift corresponding to digital phase signal PH into the generation of pixel clock signal PIX_CLK. This enables the tuning of the pixel clock PIX_CLK applied to ADCs 44, so that the optimum fidelity can be attained by video decoder 52.

According to this embodiment of the invention, the phase selection by multiplexers 240a, 240b, is again effected by two adder legs. The first leg includes adder 234, which adds the thirty-two bit value on lines FREQ <31:0> with the thirty-two bit value from register 236, which is the register receiving (with clock signal CLK2) the sum generated by adder 234 itself. The five most significant bits of the contents of register 236 are applied to one input of multiplexer 237, which receives the phase signal PH at its other input. Multiplexer 237 selects phase signal PH when enable signal EN1 is inactive, and selects the output of register 236 when enable signal EN1 is active. The selected value at the output of multiplexer 237 is applied to register 238 for storage on the next rising edge of output clock CLK2, and then applied to the select inputs of multiplexer 240a.

The second leg of flying-adder frequency synthesis circuit 74' includes adder 242, which receives a five bit digital value on lines FREQ<32:28> at one input, and the five-bit integer portion of the contents of register 236 at its second input. Adder 242 sums these two values, and applies the sum to one input of multiplexer 243. Multiplexer 243 also receives phase signal PH at a second input. Multiplexer 243 selects phase signal PH when enable signal EN1 is inactive, and selects the output of register 244 when enabled by enable signal EN1. The value presented at the input of multiplexer 243 is stored in register 244 with a rising edge of output clock signal CLK2, and is clocked into register 245 on the next rising edge of pixel clock signal PIX_CLK. The output of register 245 is presented to the select input of multiplexer 240b.

In this embodiment of the invention, multiplexer 246 is controlled by pixel clock signal PIX_CLK, so that the output of multiplexer 240a is forwarded to the clock input of flip-flop 248 responsive to pixel clock signal PIX_CLK being high ("1") and so that the output of multiplexer 240b is forwarded responsive to pixel clock signal PIX_CLK being low ("0"). Clock signals PIX_CLK, CLK2 are produced by flip-flop 248 as shown.

Flying-adder frequency synthesis circuit 74' operates in substantially the same fashion as flying-adder frequency synthesis circuit 74 described above relative to FIG. 7. The particular clock phases that are selected by flying-adder frequency synthesis circuit 74' are initialized by phase signal PH through the operation of multiplexers 237, 243. During such time as flying-adder frequency synthesis circuit 74' is not enabled (line EN1 inactive), the clock phases indicated by phase signal PH will be selected by multiplexers 240a, 240b, thus toggling flip-flop 248 to generate clock signals PIX_CLK, CLK2 at one-half the frequency of VCO 72. Once flying-adder frequency synthesis circuit 74' is enabled, the clock phases are selected by the accumulation of the selection value on lines FREQ in the manner described above.

It is contemplated that this ability to adjust the phase of pixel clock PIX_CLK will be important in many applications, particularly those such as high-performance video decoders in which the sample times are to be precisely controlled.

Referring back to FIGS. 5 and 6, another optional feature in connection with video decoder 52 is provided by video mode detection logic 65. As known in the art, multiple video standards are known and used in the art. Many of these standards are promulgated through the Video Electronics Standards Association (VESA). These standards, examples of which include VGA, SVGA, 8514/A, XGA, XGA-2, VBE, and the like, support various levels of resolution, color modes, refresh rates, and the like. The pixel rate varies among these video modes, and as such video decoder 52 is required to generate the appropriate pixel clock, or sample clock, appropriate for the video mode of the input video signal. These multiple video standards are common enough that it is useful for a video decoder to have the capability of decoding input video signals from any one of multiple standards. In conventional video decoders, this capability is provided by the user knowing the input video signal standard, and selecting the operating mode of the input signal by way of switches, BIOS settings, or operating system functionality.

It has been observed, in connection with this invention, that the horizontal and vertical sync pulse frequencies differ among these video standards. According to this embodiment of the invention, video mode detection logic 65 measures these frequencies, and automatically determines the video standard defining the input video signal without requiring intervention from the host system, user inputs, BIOS settings, and the like.

Figure 9:
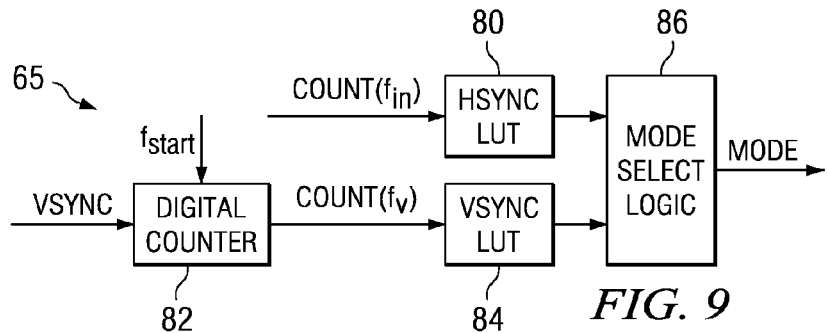
FIG. 9 is an electrical diagram, in block form, of video mode detect logic as optionally used in connection with the video decoder of the first preferred embodiment of the invention.

Referring now to FIG. 9, the construction of video mode detection logic 65 according to this embodiment of the invention will now be described. As described above relative to FIG. 6, DCO 60 includes digital counter 70 that measures the frequency of horizontal sync clock signal HSYNC, by counting a number of fixed-frequency ($f_{start}$) clock pulses between edges of clock signal HSYNC. This count value COUNT($f_m$) is communicated not only to conversion logic 76 (FIG. 6), but also to HYSNC look-up table (LUT) 80 in video mode detection logic 65 as shown in FIG. 9. Similarly, digital counter 82 receives the vertical sync clock signal VSYNC, and also the fixed-frequency (stat) clock signals from flying-adder frequency synthesizer 74S of DCO 60, and counts the number of pulses of the fixed-frequency ($f_{start}$) clock between successive edges of clock signal VSYNC. The resulting count value COUNT($f_v$) corresponds to the vertical sync frequency, and is communicated to VSYNC LUT 84.

HSYNC LUT 80 and VSYNC LUT 84 are preferably conventional look-up tables (or alternatively, a single combined look-up table) used to derive indications of the particular video mode from the measured HSYNC and VSYNC frequencies, respectively. These indications are forwarded to mode select logic 86, which combines or otherwise processes the video mode indications from LUTs 80, 84 to produce a video mode output signal MODE. Video mode output signal MODE is supplied to DCO 60 of FIG. 5. More specifically, video mode output signal MODE is preferably applied to conversion logic 76 of DCO 60, so that the video mode can be used to derive the frequency control word FREQ to be applied to flying-adder frequency synthesis circuit 74, so that the pixel clock PIX_CLK can be set to the appropriate frequency for the video mode and horizontal sync HSYNC frequency.

Various alternatives to the frequency measurement of video mode detection logic 65 may be implemented. For example, video mode detection logic 65 may have its own VCO and flying-adder frequency synthesizer circuit for generating the fixed-frequency clock pulse used to measure the horizontal and vertical sync frequencies. A separate digital counter may be provided for separately measuring the horizontal sync frequency, rather than simply borrowing the count COUNT($f_m$) from DCO 60. It is contemplated that these and other alternatives may be used to realize video mode detection logic 65.

As a result of this embodiment of the invention, therefore, automatic detection and use of the video mode of the input video signal is provided. This capability reduces the amount of overhead setup and control, and enables the video decoder and video system to rapidly and automatically change its pixel sample rates with changes in the input video signal mode.

As mentioned above, it is contemplated that the ability to precisely tune the phase of the pixel clock can be important in high-performance video systems. It is also contemplated, in connection with this invention, that factors such as propagation delay, load conditions, and the like may differ among the multiple components of the input video signal. It is further contemplated, in connection with this invention, that in high precision video systems, such as those contemplated for HDTV, these variations among components can result in a loss of fidelity if a single pixel clock is used to sample all components, even if phase tuning of the pixel clock is available as described above. The variations in load and propagation delay among components may prevent a single sample point from accurately sampling all components, especially at high frequencies.

Figure 10:
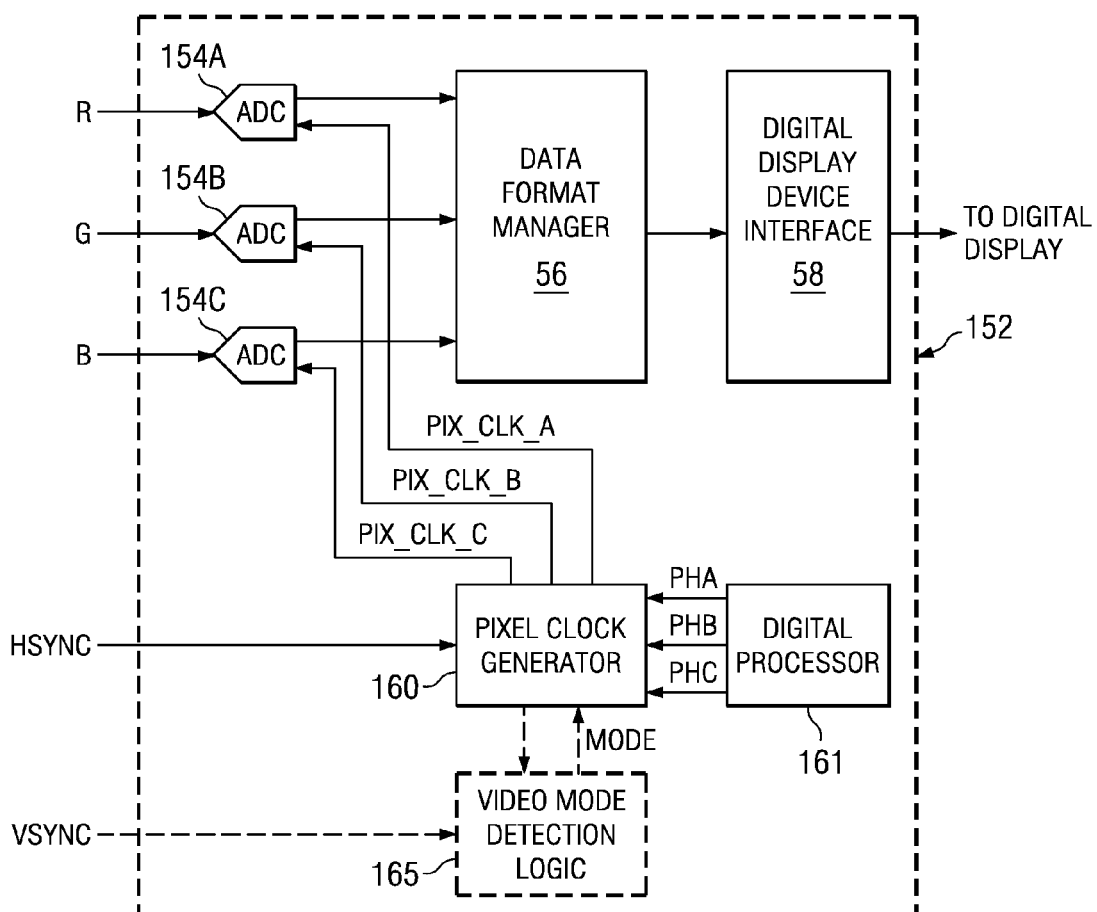
FIG. 10 is an electrical diagram, in block form, of a video decoder constructed to another preferred embodiment of the invention.

FIG. 10 illustrates video decoder 152, constructed according to a third preferred embodiment of the invention, in which multiple pixel clocks are generated, one for each input video component, and each tuned by a corresponding phase signal so that sampling of each component can be separately optimized. As before, three ADCs 154A, 154B, 154C are provided in video decoder 152, each for digitizing a corresponding video signal input component. Pixel clocks PIX_CLK_A, PIX_CLK_B, PIX_CLK_C are separately provided by pixel clock generator 160 to ADCs 154A, 154B, 154C, respectively, to define the sample frequencies and times. According to this embodiment of the invention, these pixel clocks PIX_CLK_A. PIX_CLK_B, PIX_CLK_C are separately tuned in phase, by pixel clock generator 160, in response to phase signals PHA, PHB, PHC from digital processor 161.

The digitized samples from ADCs 154A, 154B, 154C are forwarded to data format manager 56 and digital display device interface 58 for processing, as described above relative to video decoder 52 of FIG. 5. In addition, video mode detection logic 165 is optionally provided in video decoder 152, to automatically detect the video mode of the input signal, as described above relative to FIG. 9.

Figure 1:
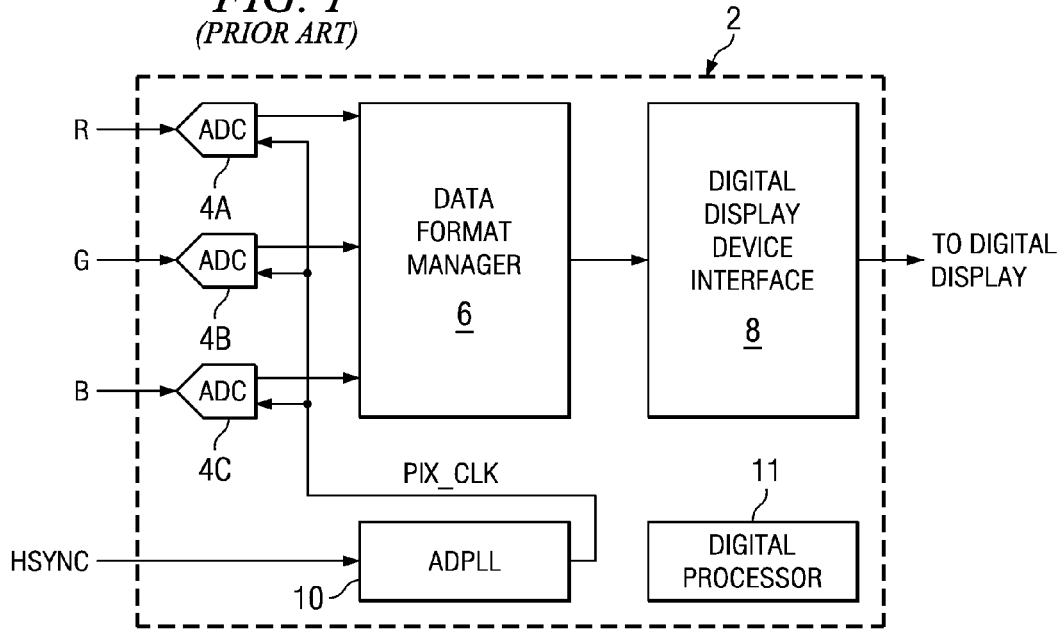
FIG. 1 (Prior Art) is an electrical diagram, in block form, of a conventional video decoder.
Figure 2:
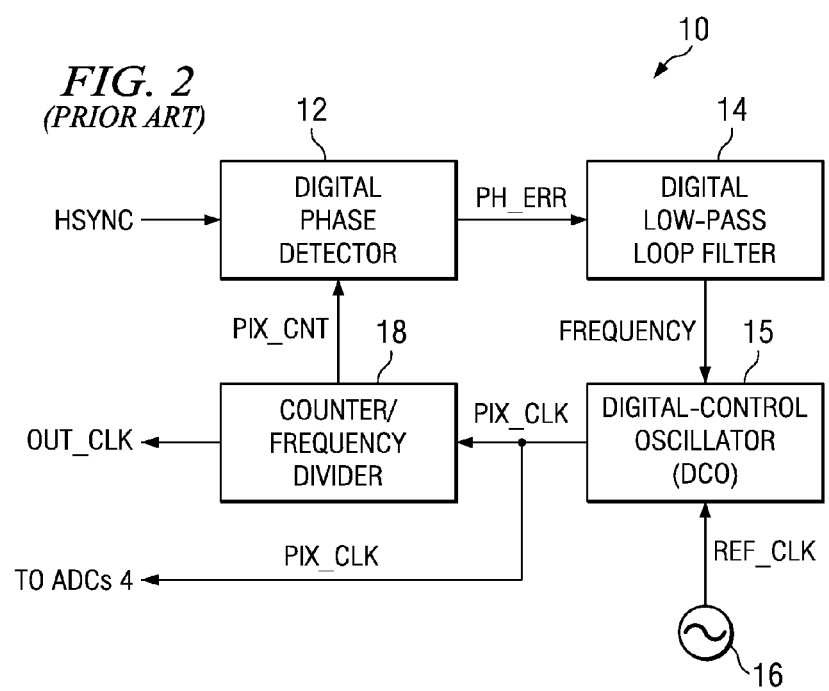
FIG. 2 (Prior Art) is an electrical diagram, in block form, of an all-digital phase-locked loop (ADPLL) as used in the conventional video decoder of FIG. 1.

Pixel clock generator 160 can be based on a DCO architecture as described above relative to FIG. 6, or based on an all-digital phase-locked loop (ADPLL) construction, similar to that described above relative to FIG. 2. Each of these architectures will now be described.

FIG. 11 illustrates the construction of pixel clock generator 160 according to the DCO architecture. As before, VCO 172 provides multiple phases of a fixed frequency clock signal to each of flying-adder frequency synthesizers 174S, and 174A through 174C. Flying-adder frequency synthesizer 174S receives a digital value FREQ_START, and generates a clock signal at a fixed high frequency $f_{start}$ (e.g., 500 MHz or higher) that is used by digital counter 70 to measure the horizontal sync HSYNC frequency. Conversion logic 76 receives this measurement COUNT($f_{in}$), and generates an appropriate digital control word FREQ (based on the detected video mode, if video mode detection logic 165 is implemented) that is applied to each of flying-adder frequency synthesizers 174A through 174C. Digital processor 161 applies phase values PHA, PHB, PHC to frequency synthesizers 174A, 174B, 174C, respectively, to tune the phase of the resulting respective pixel clocks PIX_CLK_A, PIX_CLK_B, PIX_CLK_C.

Figure 8B:
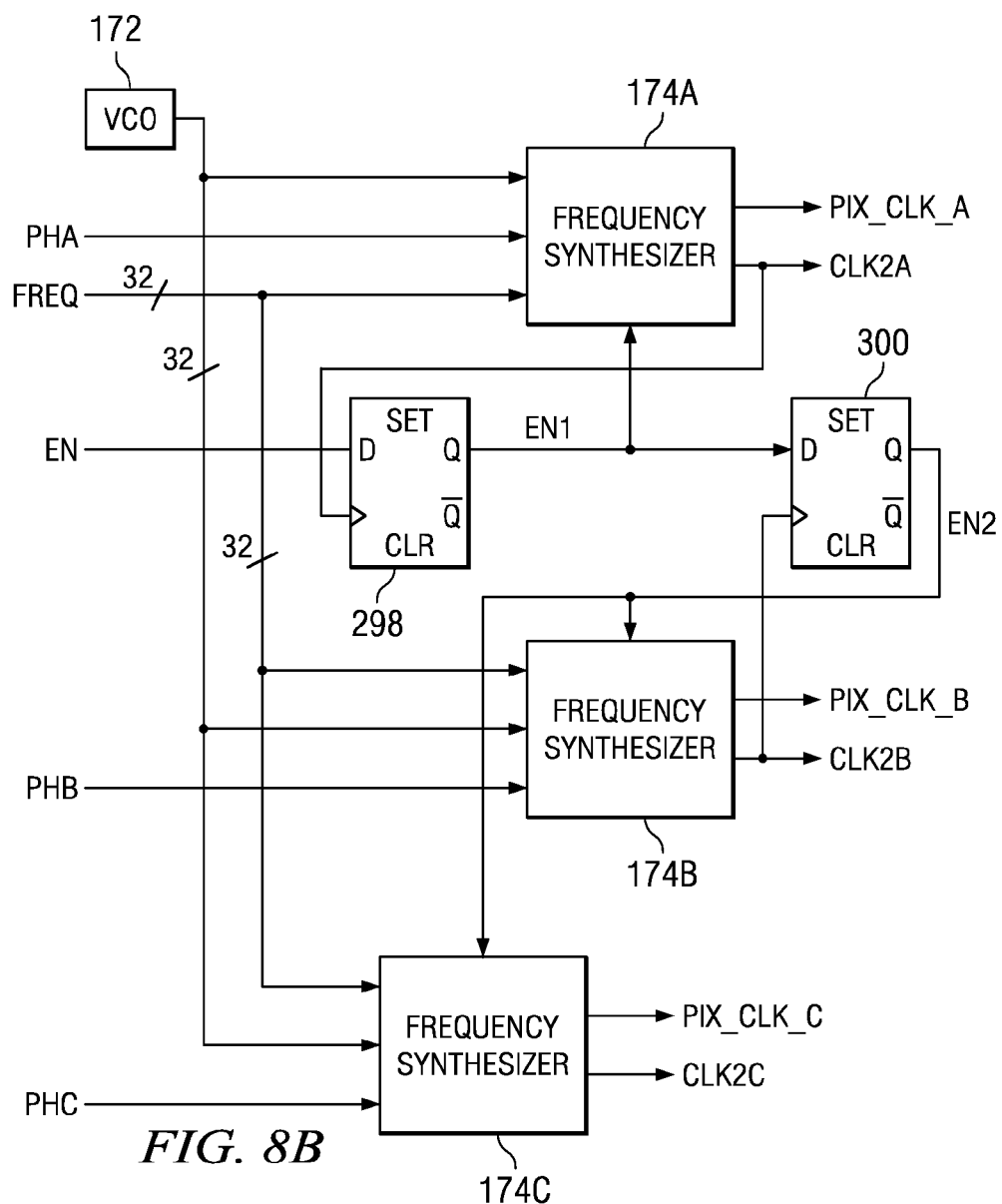

The arrangement of flying-adder frequency synthesis circuits 174A through 174C, and their respective phase relationships, can be constructed in the manner described in U.S. patent application Publication No. US 2003/0118142A1, published Jun. 26, 2003, from copending and commonly assigned application Ser. No. 10/026,489, filed Dec. 24, 2001, incorporated herein by reference. FIG. 8B illustrates an example of an overall architecture in which pixel clock generator 160 generates multiple pixel clock signals, each at a selected phase that can differ from one another, for application to individual ones of ADCs 154 as shown in FIG. 10. In this example, as before, VCO 172 generates multiple clock phases, for example thirty-two clock phases, which are applied to flying-adder frequency synthesis circuits 174A, 174B, and 174C. Each of frequency synthesis circuits 174 receive a digital frequency selection signal on lines FREQ, including both an integer portion and a fractional portion as described above. As shown in FIG. 8B, a general enable signal is provided on line EN. Line EN is applied to the D input of flip-flop 298, which is clocked by clock signal CLK2A from the output of frequency synthesis circuit 174A as described above, and which produces enable signal EN1 at its positive output. Line EN1 is applied to the D input of flip-flop 300, which is clocked by clock signal CLK2B from the output of frequency synthesis circuit 174B, to produce enable signal EN2 at its positive output. Frequency synthesis circuits 174B, 174C are both enabled by an enable signal EN2. In this manner, frequency synthesis circuits 174B, 174C are not enabled until frequency synthesis circuit 174A has generated at least one pulse on lines PIX_CLK_A, CLK2A after it has been enabled. Until then, frequency synthesis circuits 174B, 174C operate in an initializing mode, and generate signals at their outputs at a reduced frequency when not enabled by their respective enable signals EN1, EN2.

In this embodiment of the invention, frequency synthesis circuits 174A, 174B, 174C receive phase signals PHA, PHB, PHC, respectively. As described in previously mentioned copending application Ser. No. 10/026,489, published as U.S. patent application Publication US 2003/0118142 A1, commonly assigned and incorporated herein by reference, and as will also be apparent from this description, the differences among phase signals PHA, PHB, PHC determine the relative phase shift among the output pixel clock signals PIX_CLK_A, PIX_CLK_B, PIX_CLK_C.

Figure 8C:
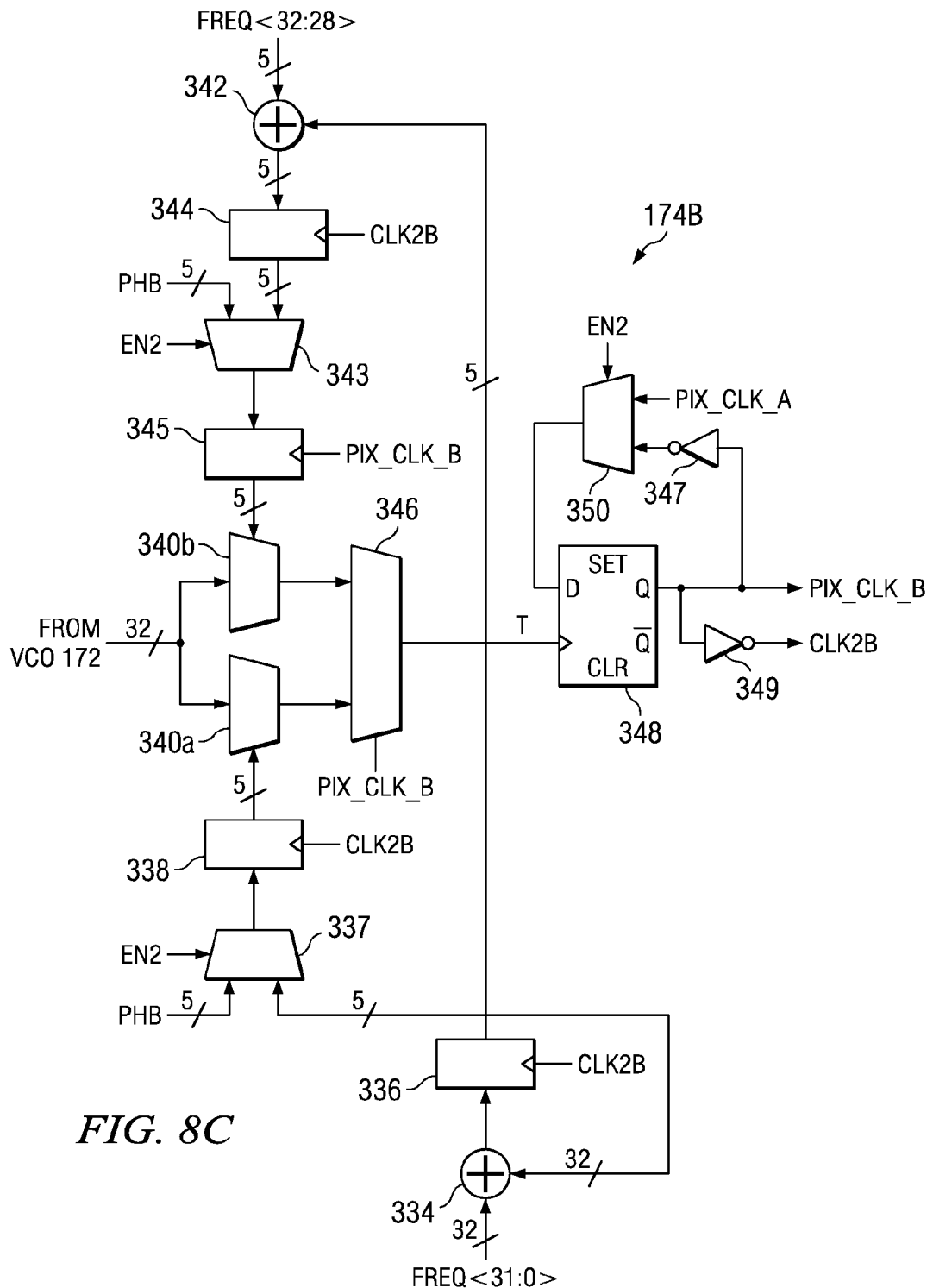

The construction of frequency synthesis circuit 174A corresponds to that described above relative to FIG. 8A for frequency synthesis circuit 74'. FIG. 8C shows this construction for the example of frequency synthesis circuit 174B. In this embodiment of the invention, frequency synthesis circuit 174C is preferably constructed identically as frequency synthesis circuit 174B of FIG. 8C. The clock phases from VCO 172 are applied to inputs of multiplexers 340a, 340b, which are thirty-two-to-one multiplexers for selecting clock phases according to the digital value applied by registers 345, 338, respectively. The outputs of multiplexers 340a, 340b are connected to inputs of two-to-one multiplexer 346, which selects between the outputs of multiplexers 340a, 340b, in response to output pixel clock signal PIX_CLK_B. The output of multiplexer 346 in turn is connected to the clock input of D-type flip-flop 348, configured in toggle fashion, driving pixel clock signal PIX_CLK_B from its positive output. Complementary clock signal CLK2B is generated from inverter 349 (or alternatively from the negative output of flip-flop 348, if desired).

The toggle configuration of flip-flop 348 is implemented, in this example, by inverter 347 having its input connected to the positive output of flip-flop 348, and having its output applied to one input of multiplexer 350. Pixel clock signal PIX_CLK_A from frequency synthesis circuit 174A is applied to a second input of multiplexer 350, and multiplexer 350 is controlled by enable signal EN2. The output of multiplexer 350 is applied to the D input of flip-flop 348. Multiplexer 350 selects pixel clock signal PIX_CLK_A when enable line EN2 is inactive, ensuring in this case that pixel clock signal PIX_CLK_B lags (rather than leads) clock signal CLK1. Once enabled by line EN2 being active, flip-flop 348 operates in conventional toggle fashion.

According to this embodiment of the invention, the phase selection by multiplexers 340a, 340b, is again effected by two adder legs. In a first leg, adder 334 adds the thirty-two bit value on lines FREQ <31:0> with the thirty-two bit value from register 336 coupled to the output of adder 334, so that adder 334 and register 336 operate as an accumulator. The five most significant bits of the contents of register 336 and phase signal PHB are applied to the inputs of multiplexer 338, which selects phase signal PHB when enable signal EN2 is inactive, and selects the integer portion of register 336 when enable signal EN2 is active. The value selected by multiplexer 337 is clocked into register 338 by output clock CLK2B, and then forwarded to the select inputs of multiplexer 340a.

In the second leg of phase-shift frequency synthesis circuit 174B, adder 342 sums a five bit digital value on lines FREQ<32:28> with the five-bit integer portion of the contents of register 336, and applies the sum to one input of multiplexer 343, which receives phase signal PHB at a second input. Multiplexer 343 selects phase signal PHB when enable signal EN2 is inactive, and selects the output of register 344 when enable signal EN2 is active. The selected value is clocked into register 345 by the next rising edge of pixel clock signal PIX_CLK_B. The output of register 345 is presented to the select input of multiplexer 340b.

In operation, referring to FIGS. 8B and 8C in combination, frequency synthesis circuits 174A through 174C operate in a determinate relationship when not enabled (lines EN1, EN2 inactive). In this state, frequency synthesis circuits 174 generate their respective pixel clock signals at one-half the frequency of VCO 172. As a result of this construction and operation, therefore, pixel clock signal PIX_CLK_B will lag pixel clock signal PIX_CLK_A by a phase-shift:

(PHB−PHA)Δ where Δ is the phase difference between adjacent clock phases at the output of VCO 172. The phase relationship between pixel clock signals PIX_CLK_C and PIX_CLK_A is similarly defined. This determinate operation of frequency synthesis circuits 174 continues so long as enable line EN1 remains inactive.

Upon enabling by enable line EN1 driven active by control circuitry located elsewhere on the integrated circuit containing frequency synthesis circuits 174, frequency synthesis circuit 174A begins generating its pixel clock signal PIX_CLK_A at the clock frequency (i.e., the number of clock phases between transitions) selected on lines FREQ, in the manner described above. The active state on enable line EN1 will propagate to enable line EN2 on the next rising edge of complementary output clock signal CLK2, through the operation of flip-flop 300 (FIG. 8B), causing frequency synthesis circuits 174B, 174C to begin generating their pixel clock signals PIX_CLK_B, PIX_CLK_C at the same frequency corresponding to the value on lines FREQ, by causing multiplexers 337, 343 to select their corresponding incoming sums for application to multiplexers 340b, 340a, respectively. In addition, because of the operation of multiplexer 350 now selecting output clock signal CLK1B for application to the D input of flip-flop 348, the phase difference indicated by (PHB-PHA)Δ is maintained after enabling. Similar phase relationships are maintained between frequency synthesis circuits 174C, 174A.

According to this implementation, enable line EN1 (and thus enable line EN2) should be driven inactive prior to making changes in the phase signals PHA, PHB, PHC. This will ensure that the desired phase-shift among the pixel clock signals will result. Of course, other arrangements among multiple flying-adder frequency synthesis circuits, for generating multiple phase-shifted pixel clocks for application to ADCs 154 in the system of FIG. 10 may alternatively be implemented.

As mentioned above, pixel clock generator 160 may alternatively be based on an ADPLL. FIG. 12 illustrates pixel clock generator 160' constructed in this manner. In this alternative architecture, multiple-phase ADPLL 120 is constructed similarly as ADPLL 20 of FIG. 2, and generates a multiple-phase output clock that is applied to each of flying-adder frequency synthesis circuits 174A through 174C as shown in FIG. 12. In this construction, the pixel clock signals are not based on a multiple of the measured HSYNC frequency, but rather on a clock signal that is phase-locked to clock signal HSYNC. The phase relationship among flying-adder frequency synthesis circuits 174A through 174C, in response to phase signals PHA through PHC, respectively, follows that described above relative to FIGS. 8B, 8C, and 11 described above.

According to these embodiments of the invention described relative to FIGS. 11 and 12, therefore, individually tunable sample clocks are provided to each of multiple ADCs. The adjustability of the phase of each of these sample clocks permits compensation of the sample clocks for differences in propagation delay, load conditions, and the like among the various component signals that are being sampled. It is therefore contemplated that improved precision and fidelity in the resulting formatted video signal will be provided, even for high data rate signals such as HDTV and other high-resolution signals.

According to the preferred embodiment of the invention, therefore, important improvements in the generation of stable clock signals are provided. Excellent precision in the resulting clock signal can be attained very quickly in response to changes in the reference clock frequency, at large frequency multiples of the reference signal, and in a manner that can be closely tuned for optimization with the input signals.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of generating a clock signal, comprising:
   receiving a periodic input signal;
   measuring a frequency of the input signal;
   generating a frequency control word responsive to the measured frequency;
   generating a plurality of clock phases at a fixed frequency; and
   operating a first flying-adder frequency synthesis circuit to generate a clock signal by selecting ones of the plurality of clock phases responsive to the frequency control word;
   wherein the measuring step comprises:
   operating a second flying-adder frequency synthesis circuit to generate a counter clock signal by selecting ones of the plurality of clock phases responsive to a selected frequency control word; and
   counting pulses of the counter clock signal occurring relative to selected edges of the periodic input signal.

2. The method of claim 1, wherein the step of generating a frequency control word comprises deriving the frequency control word responsive to the result of the counting step.

3. The method of claim 1, further comprising applying a phase adjustment signal to the first flying-adder frequency synthesis circuit; wherein the first flying-adder frequency synthesis circuit is operated to generate the clock signal by selecting ones of the plurality of clock phases responsive to the frequency control word and the phase adjustment signal.

4. The method of claim 1, wherein the frequency of the clock signal is at a selected multiple of the periodic input signal.

5. The method of claim 4, wherein the selected multiple is greater than about five hundred.

6. A clock generation circuit, comprising:
   circuitry for measuring a frequency of a periodic input signal;
   an oscillator for generating multiple phases of a reference clock;
   circuitry for generating a frequency control word responsive to the measured frequency of the periodic input signal; and
   a first flying-adder frequency synthesis circuit, having inputs receiving the multiple phases of the reference clock from the oscillator, and having a control input for receiving the frequency control word, for generating an output clock signal by selecting first and second ones of the multiple phases of the reference clock responsive to the frequency control word;

wherein the measuring circuitry comprises:

a second flying-adder frequency synthesis circuit, having inputs receiving the multiple phases of the reference clock from the oscillator, and having a control input for receiving a start frequency control word, for generating a counter clock signal by selecting first and second ones of the multiple phases of the reference clock responsive to the start frequency control word; and a digital counter, for counting pulses of the counter clock signal relative to selected edges of the periodic input signal.

7. The circuit of claim 6, wherein the first flying-adder frequency synthesis circuit comprises:

a first multiplexer, for forwarding a selected one of the multiple phases responsive to a first select signal;

a second multiplexer, for forwarding a selected one of the multiple phases responsive to a second select signal;

a first adder leg, having an input for receiving a frequency select word having an integer portion and a fractional portion, for generating the first select signal corresponding to an accumulation of the frequency select word;

a second adder leg, having an input for receiving a portion of the frequency select word, for generating the second select signal corresponding to a sum of the portion of the frequency select word with an accumulation of the frequency select word;

a toggle multiplexer, having first and second inputs coupled to the outputs of the first and second multiplexers, for toggling a selection of its inputs in sequence; and a multivibrator, having a clock input coupled to an output of the toggle multiplexer, for inverting an output of the multivibrator responsive to a transition at its clock input;

wherein the first and second adder legs of the first frequency synthesis circuit receive a phase value, and are enabled by a first enable signal so that, when the first enable signal is inactive, the first frequency synthesis circuit generates a signal at the output of its multivibrator responsive to a first selected clock phase corresponding to the phase value.

8. A digital system, comprising:

a plurality of analog-to-digital converters, each having a data input and a sample clock input; and a sample clock generator, for generating the sample clock for the plurality of analog-to-digital converters, comprising:

circuitry for generating a plurality of clock phases; and a plurality of flying-adder frequency synthesis circuits each having inputs coupled to receive the plurality of clock phases, for generating one of a plurality of sample clocks by selecting clock phases from the plurality of clock phases responsive to the frequency control word and to one of a plurality of phase input signals.

9. The system of claim 8, wherein the sample clock generator further comprises a digital phase-locked loop for generating the sample clock, including:

a phase detector having a first input for receiving a periodic signal corresponding to the input signal, and having a feedback input for receiving a feedback signal, for generating a digital phase error signal corresponding to a phase difference between the input signal and sample clock signal;

a digital loop filter, receiving the digital phase error signal at an input and generating a frequency control word from the digital phase error signal; and feedback circuitry, for generating the feedback signal to the phase detector based on the pixel clock signal from the at least one flying-adder frequency synthesis circuit.

10. The system of claim 8, further comprising a digital processor, for generating the phase input signal.

11. The system of claim 10, wherein the digital loop filter comprises a sequence of program instructions executed by the digital processor, the sequence including applying the at least one gain value.

12. The system of claim 8, wherein the sample clock generator comprises:

circuitry for measuring a frequency of a periodic signal corresponding to the input signal;

an oscillator for generating multiple phases of a reference clock;

circuitry for generating a frequency control word responsive to the measured frequency of the periodic input signal; and a first flying-adder frequency synthesis circuit, having inputs receiving the multiple phases of the reference clock from the oscillator, having a control input for receiving the frequency control word, and having a phase input for receiving the phase input signal, for generating the sample clock by selecting first and second ones of the multiple phases of the reference clock responsive to the frequency control word and the phase input signal.

13. The system of claim 8, wherein the sample clock generator further comprises:

circuitry for measuring a frequency of a periodic signal corresponding to the input signal;

an oscillator for generating multiple phases of a reference clock; and circuitry for generating the frequency control word responsive to the measured frequency of the periodic input signal.

14. The system of claim 13, wherein the measuring circuitry comprises:

a second flying-adder frequency synthesis circuit, having inputs receiving the multiple phases of the reference clock from the oscillator, and having a control input for receiving a start frequency control word, for generating a counter clock signal by selecting first and second ones of the multiple phases of the reference clock responsive to the start frequency control word; and a digital counter, for counting pulses of the counter clock signal relative to selected edges of the periodic input signal.

* * * * *